Feb. 1, 1966 L. TASSARA 3,231,960

PROCESS FOR MAKING ELECTRICAL COMPONENTS AND COMPONENTS MADE THEREBY

Filed Dec. 21, 1962 2 Sheets-Sheet 1

INVENTOR.
LUIGI TASSARA
BY [signature]
ATTORNEY

INVENTOR.
LUIGI TASSARA
BY Donald P. Gillette
ATTORNEY

United States Patent Office 3,231,960

Patented Feb. 1, 1966

3,231,960
PROCESS FOR MAKING ELECTRICAL COMPONENTS AND COMPONENTS MADE THEREBY

Luigi Tassara, Via Olmetto 3, Milan, Italy

Filed Dec. 21, 1962, Ser. No. 246,463
Claims priority, application Italy, Jan. 4, 1962, Patent 683,194
3 Claims. (Cl. 29—25.42)

This invention relates to the manufacture of capacitors and particularly capacitors suitable for use in printed circuits.

In accordance with this invention an insulating substrate, such as glass, is coated in isolated areas with a metal. Limited sections of the metal are then masked off and a very thin layer of dielectric material is placed over the surface of the metal as well as over unmasked portions of the substrate not covered by the metal. Subsequently a limited portion of the dielectric is masked adjacent to the previously masked portions of the metal and a second metal layer is applied over the remaining surface of the dielectric material. Contact terminals are built up by placing multiple conductive layers on the originally masked portions of the first metal layer and by placing other metal layers on another portion, preferably a central portion, of the second metal layer. Thereafter the substrate together with the layers attached thereto may be cut along pre-determined lines to separate the substrate into sections, each of which has contact terminal portions connecting with the first and second metal layers. The substrate may be further broken up into short segments to form small capacitors and the capacitance may be accurately adjusted by grinding away portions of the layers, particularly portions of the second layer.

The invention will be more completely described in the following specification together with the drawings in which.

Figures 1, 2:
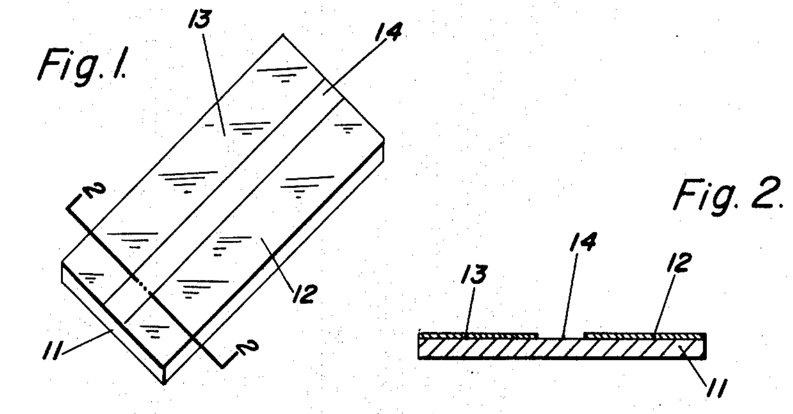
FIG. 1 shows an isometric view of a substrate with the initial metal thereon.
FIG. 2 is a cross-sectional view of FIG. 1 along the line 2—2.

Referring first to FIGS. 1 and 2 a substrate 11 of insulating material, such as glass, for example, is provided with two separated metal layers 12 and 13. These layers are preferably of metal having low resistivity such as aluminum, nickel, gold, etc. and may be produced by evaporating the desired material onto the substrate 11 in a vacuum in accordance with well known metal evaporation techniques. The metal layers 12 and 13 may be kept separately by masking the area 14 therebetween, or a single metal layer may be affixed to the substrate 11 and then a section of the area 14 may be removed therefrom. If it is desired to keep the area 14 by masking, it is only necessary to provide a strip of thin iron or steel, which can not be distorted, and to hold this in contact with the substrate by means of a magnet on the other side of the substrate. Furthermore, while only a single area 14 is shown, it is of course possible to have a number of such areas all of which are preferably arranged in parallel, straight strips.

Figures 3, 4:
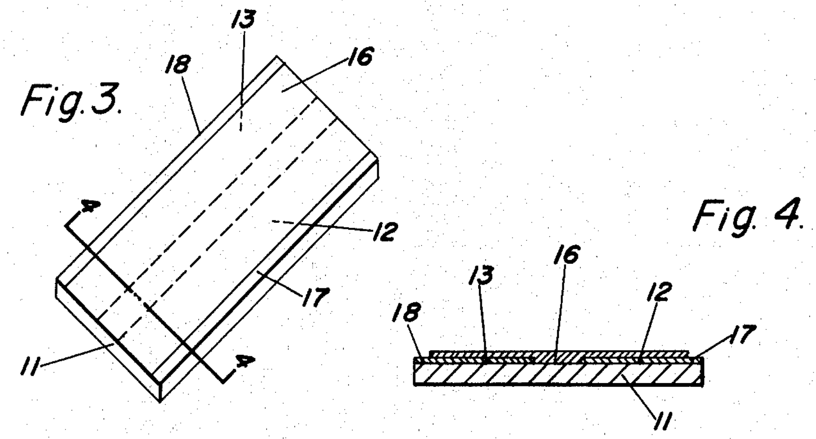
FIG. 3 is an isometric view of the substrate of FIG. 1 after the placement of a dielectric layer thereon.
FIG. 4 is a cross-sectional view of the structure of FIG-3 along the line 4—4.

FIGS. 3 and 4 illustrate the arrangement for the addition of an insulating, or dielectric, layer 16. In order to restrict the dielectric material to the proper part of the surface, the outer edge 17 of the metal layer 12 and the outer edge 18 of the metal layer 13 are masked off so that the dielectric layer 16 cannot cover these strips. The dielectric material may be applied to the surface of the metal layers 12 and 13 as well as the surface 14 therebetween by evaporating in a vacuum a suitable metal oxide, such as the monoxide of silicon, or a sulfide, such as zinc sulfide, or a floride, such as magnesium floride. The dielectric material 16 may even be a resin or lacquer of suitable electric and thermal properties, such as silicone or epoxy resins. It is desirable that the dielectric constant of the material in layer 16 be as high as possible and that the layer 16 be as thin as possible in order to achieve maximum capacitance per unit volume.

Figures 5, 6:
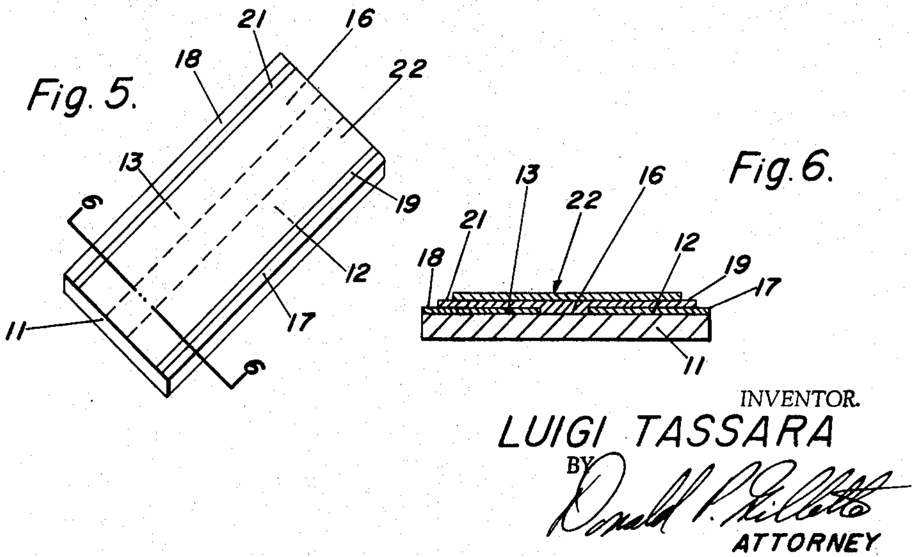
FIG. 5 is an isometric view of the structure of FIG. 3 after the addition of a second metal layer.
FIG. 6 is a cross-sectional view of the structure of FIG. 5 taken along the line 6—6.

FIGS. 5 and 6 show the addition of a second metal layer which forms the second electrode of the capacitor and hence must be kept insulated from both sections 12 and 13 of the first metal layer. This is done by masking off not only the areas 17 and 18 but additional contiguous areas 19 and 21, respectively, of the dielectric layer 16. This permits the second metal layer 22 to be added on top of the dielectric material 16 without any possibility of coming into contact with the sections 12 and 13 of the first layer.

Figure 7:
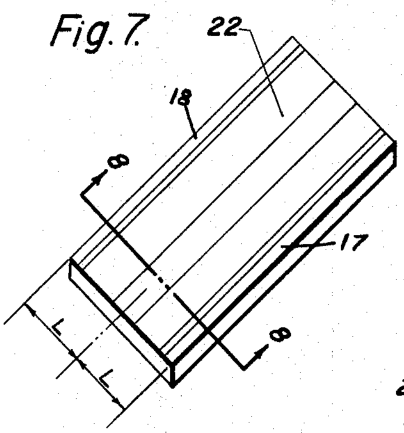
FIG. 7 shows an isometric view of the structure of FIG. 5 after the addition of contact terminal strips.

Following the deposition of the second metal layer 22 of the dielectric material 16, contact terminals must be added in order to provide means for connecting the finished capacitor to other elements of an electrical circuit. This may be done by masking the previously coated surface of the substrate 11 except for three longitudinal strips, one of which is along the center area 23 of the layer 22 and the other two of which are along the edges in the regions 17 and 18 of the bottom layers 12 and 13, as shown in FIG. 7, and then building up conductive layers thereon of metals suitable for joining to other components by soldering.

Figure 8:
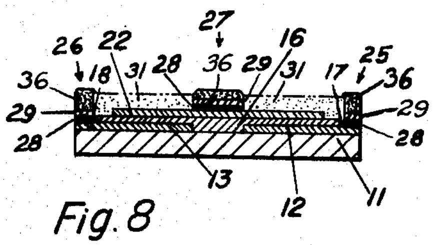
FIG. 8 shows a cross-sectional view of the structure of FIG. 7 along the line 8—8.

FIG. 8 is a cross-sectional view of the substrate 11 after the conductive layers that form three contact terminals 27–27 have been built up. The first of these layers indicated by reference character 28 is preferably a noble metal, which is preferably evaporated onto the unmasked areas in a vacuum and which has the ability to diffuse into the metal electrode layers 12, 13, and 22 so as to adhere thereto. This is particularly necessary if the electrode layers are of aluminum, which cannot be soldered to other electrical components by ordinary solder. On top of this layer 28 is a second layer 29 which may also be deposited by evaporation in a vacuum onto the surface of layer 28 prior to removal of the mask or it may be painted on by brush, either before or after removal of the mask. In the latter case the layer 26 would normally be a resinous solution of silver or gold. It is to be noted that the outer contact terminals 25 and 26 preferably do not cover the entire areas 17 and 18, respectively.

After the masks have been removed from between the electrodes, an insulating material 31, which may be a lacquer or varnish or a glass enamel, is placed on the previously masked areas and the layers are baked to cure or to polymerize both the resinous solutions in silver or gold and the insulating material 32 at the same time and cause the noble metal layer 28 to diffuse into the immediately adjacent portions of electrodes 12, 13, and 22, respectively.

Following the baking and subsequent cooling of the structure the substrate may be divided into separate capacitors 32 and 33 by cutting along the center line 34. Preferably the width of the substrate 11 is twice as great as the normal modulous, indicated by the letter L, of a printed circuit to facilitate attachment of the sections 32 and 33 directly to a printed circuit board without the necessity for providing additional wire leads. In order to facilitate attachment of the individual sections 32 and 33 it may first be desirable, after cutting the substrate 11, to protect its edges and then to immerse the two halves in a cleansing flux and then in a bath of molten solder. Alternatively, the entire substrate 11 may be immersed in the flux and in the solder before it is cut in two so as to produce a layer 36 of solder on top of the layers 29. Thereafter in order to attach the separate capacitor sections to a printed circuit board having the same standard modulous it is only necessary to place the capacitor section in contact with suitably tinned conductors on the surface of the printed circuit board and heat the capacitor enough to melt the solder layer 36 so that it will join to the tinned conductors.

Figure 9:
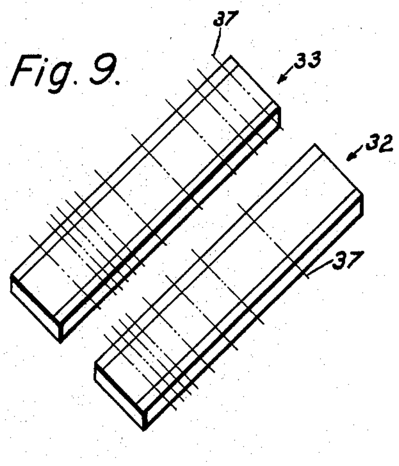
FIG. 9 shows the structure of FIG. 8 cut into individual capacitors.

Frequently, instead of using the entire sections 32 and 33 substrate 11 as capacitors, it will be sufficient merely to use a fragment thereof. FIG. 9 shows additional transverse cutting lines 37 indicated on sections 32 and 33. By cutting each of the halves 32 and 33 along these lines a number of small individual capacitors may be formed. Because of the inherent accuracy of the method of making the capacitors, the capacitance of each will be very accurately controlled. However, if it is desired to adjust the capacitance to a still greater degree of accuracy it is a simple matter to do so by merely grinding away part of the electrodes particularly the top electrode. Furthermore, the capacitance of the two sections 32 and 33 may be measured and the transverse lines 37 may be laid out in accordance with this measurement so that accurate small capacitors may be formed which will not require further adjustment.

While I have described this invention in terms of a specific embodiment it will be apparent to those skilled in the art that modifications may be made therein without departing from the true scope of the invention as defined by the following claims.

What is claimed is:

1. The method of making an electrical component comprising the steps of: coating an insulating substrate with two separated metal layers on different parts thereof; coating a portion of the surface of each of said layers with a dielectric material; coating a portion of said dielectric material overlapping said first two layers with a third metal layer; coating a portion of said third metal layer and separate portions of said first two layers with a diffusable metal layer capable of adhering thereto; applying another metal layer to the exposed surface of said diffusable layer; coating the remaining exposed surface of said third metal layer and said dielectric material and said first two metal layers with a hardenable insulating material; and baking said layers to harden said insulating material and to diffuse said diffusable layer into said first two metal layers and said third metal layer.

2. The method of making an electrical component comprising the steps of: masking a central portion of an insulating substrate; coating separate sections of the surface of said substrate adjacent to the masked portion with metal electrodes; masking the edges of said metal electrodes; coating the remainder of said electrodes and the previously masked area of said substrate with a dielectric material; masking said portions of said metal electrodes and a contiguous portion of said dielectric material; coating the remainder of said dielectric material with a third metal electrode insulated from said first electrodes; coating a portion of said first electrode and separate portions of each of said first electrodes with a layer of noble metal capable of adhering thereto; applying another metal layer to the exposed surface of said noble metal layer; coating the remaining exposed surface of said third electrode and said dielectric material and said first electrodes with a polymerizable insulating material; and baking said layers to polymerize said insulating material and to diffuse said noble metal into said first electrode and into said third electrode.

3. The method of making an electrical component comprising the steps of: masking a central straight strip of one surface of a rigid insulating substrate; evaporating a first metal layer in a vacuum onto the remainder of said surface of said substrate to form two separate electrodes; masking the outer edges of said electrodes; evaporating a dielectric layer in a vacuum onto the unmasked portion of said electrodes; masking said outer edges of said electrodes and the contiguous portions of said dielectric material; evaporting a third metal electrode in a vacuum onto the unmasked portion of said dielectric material; masking said third electrode except for a central strip and masking the exposed portions of said dielectric material; evaporating a layer of noble metal in a vacuum onto the unmasked outer strips of said first electrodes and onto the unmasked central strip of said third electrode; applying a conductive material to said noble metal; covering the previously masked surface of said third electrode and the exposed surface of said dielectric material with a polymerizable insulating material; baking said layers to polymerize said insulating material and to diffuse said noble metal into said first electrode and into said third electrode; coating said conductive material with solder; dividing said substrate into two parts along the center thereof; measuring the capacitance between said third electrode and the respective one of said first electrodes on each of the divided parts; and subdividing each of said parts into capacitors having predetermined capacitance calculated according to the measurement of each of said parts.

References Cited by the Examiner

UNITED STATES PATENTS

| | | | |
|---|---|---|---|
| 2,839,816 | 6/1958 | McGraw | 29—25.42 |
| 2,956,220 | 10/1960 | Kohring | 317—260 |
| 2,958,117 | 11/1960 | Robinson | 29—25.42 |
| 3,024,394 | 3/1962 | Salisbury | 317—260 |

RICHARD H. EANES, Jr., *Primary Examiner.*